United States Patent [19]

Iranmanesh et al.

[11] Patent Number: 4,641,416

[45] Date of Patent: Feb. 10, 1987

[54] METHOD OF MAKING AN INTEGRATED CIRCUIT STRUCTURE WITH SELF-ALIGNED OXIDATION TO ISOLATE EXTRINSIC BASE FROM EMITTER

[75] Inventors: Ali Iranmanesh, Mountain View; Christopher O. Schmidt, Sunnyvale, both of Calif.

[73] Assignee: Advanced Micro Devices, Inc., Sunnyvale, Calif.

[21] Appl. No.: 707,730

[22] Filed: Mar. 4, 1985

[51] Int. Cl.[4] .................. H01L 21/302; H01L 21/265
[52] U.S. Cl. ............................. 29/576 W; 29/576 B; 29/578; 29/580; 148/1.5; 148/171; 148/188; 148/DIG. 10; 148/DIG. 50; 148/DIG. 85; 148/DIG. 117
[58] Field of Search ............... 29/576 W, 576 B, 578, 29/580; 148/188, 1.5, 171, DIG. 10, DIG. 11, DIG. 50, DIG. 51, DIG. 85, DIG. 86, DIG. 117; 156/644, 648, 649; 357/50, 34

[56] References Cited

U.S. PATENT DOCUMENTS 4,412,378 11/1983 Shinada .................................. 29/578
4,418,468 12/1983 Vora et al. ......................... 29/577 C

OTHER PUBLICATIONS

Ghondi, ULSI Fabrication Principles Silicon and Gallium Arsenide, John Wiley and Sons, New York, 1983, pp. 160-163.

*Primary Examiner*—N. E. Hearn
*Assistant Examiner*—John Callahan
*Attorney, Agent, or Firm*—Patrick T. King; John P. Taylor; J. Vincent Tortolano

[57] ABSTRACT

The invention comprises an improved integrated circuit structure wherein an active device is formed in a silicon substrate for forming an intrinsic base region over a buried collector and an emitter is formed on the intrinsic base region to comprise three electrodes of the active device and at least one extrinsic base segment is formed in the substrate adjacent to the intrinsic base region to provide a contact for the intrinsic base; the improvement which comprises: separating the extrinsic base segment from the emitter formed on the intrinsic base to prevent the formation of a parasitic P-N junction between the extrinsic base and the emitter.

10 Claims, 13 Drawing Figures

METHOD OF MAKING AN INTEGRATED CIRCUIT STRUCTURE WITH SELF-ALIGNED OXIDATION TO ISOLATE EXTRINSIC BASE FROM EMITTER

BACKGROUND OF THE INVENTION

1. Field of the Invention

This invention relates to improvements in integrated circuit structures using self-aligned contacts to the base of an active device. More particularly, this invention relates to an integrated circuit device having self-aligned local oxide to isolate the extrinsic base from another electrode of the transistor, such as an emitter.

2. Description of the Prior Art

In the construction of a high performance bipolar transistor using a self-aligned contact to the base region, an extrinsic base is formed in the silicon substrate adjacent the intrinsic base of the device. Such a construction is described in Jambotkar U.S. Pat. No. 4,319,932 and in an article by Ning et al entitled "Self-aligned Bipolar Transistors for High-Performance and Low-Power-Delay VLSI", published in the IEEE Transactions on Electron Devices, Vol. ED-28, No. 9, Sept. 1981, on pages 1010–1013. However, the formation of an emitter in or above the intrinsic base in this type of structure can result in the formation of a parasitic P-N junction between the emitter and the extrinsic base. This parasitic diode degrades the current gain or beta of the transistor.

FIG. 1 shows a typical prior art construction of such a device. A polysilicon layer is normally anisotropically etched to expose a portion of the silicon substrate in which the intrinsic base is formed. An extrinsic base region is then formed in the substrate adjacent the intrinsic base by diffusing dopant through the polysilicon and into the silicon substrate, usually at the same time as oxide is formed along the polysilicon sidewall. Contact alignment between the polysilicon layer and the extrinsic base region is thus assured.

When an emitter is subsequently formed on or in the surface of the intrinsic base, the amount of separation of the emitter from the extrinsic base will depend upon the thickness of the oxide on the sidewall of the etched polysilicon layer and the amount of lateral diffusion of the extrinsic base. Thus, the current gain of the transistor becomes sensitive to the lateral thickness of the oxide wall layer which separates the extrinsic base from the emitter.

It would, therefore, be desirable to independently isolate the extrinsic base of a self aligned contact integrated circuit device from the emitter portion of the device independent of the thickness of the wall oxide.

SUMMARY OF THE INVENTION

It is therefore an object of this invention to provide an improved integrated circuit structure having a self-aligned base contact with an isolating area between the extrinsic base and the emitter electrode above the intrinsic base region.

It is another object of the invention to provide an improved integrated circuit structure having a self-aligned base contact with an isolating area between the extrinsic base and the emitter electrode above the intrinsic base region formed by selectively etching a portion of the silicon substrate between the extrinsic base region and the intrinsic base region.

It is a further object of this invention to provide an improved integrated circuit structure having a self-aligned base contact with an isolation area between the extrinsic base and an electrode above the intrinsic base region formed by selectively etching a portion of the silicon substrate between the extrinsic base region and the intrinsic base region and then filling this peripheral etched portion with an isolation oxide.

These and other objects of the invention will become apparent from the following description and accompanying drawings.

In accordance with the invention, an improved integrated circuit structure is provided wherein an active device is formed in a silicon substrate by forming an intrinsic base region over a buried electrode and another electrode is formed above the intrinsic base region to comprise three electrodes of the active device and at least one extrinsic base portion is formed in the substrate adjacent the intrinsic base region to provide a self aligned contact for the intrinsic base. The improvement comprises: a self-aligned insulating barrier between the extrinsic base and the emitter electrode formed over the intrinsic base in order to prevent the formation of a P-N junction between the extrinsic base and the electrode formed over the intrinsic base.

DESCRIPTION OF THE INVENTION

Figure 1:
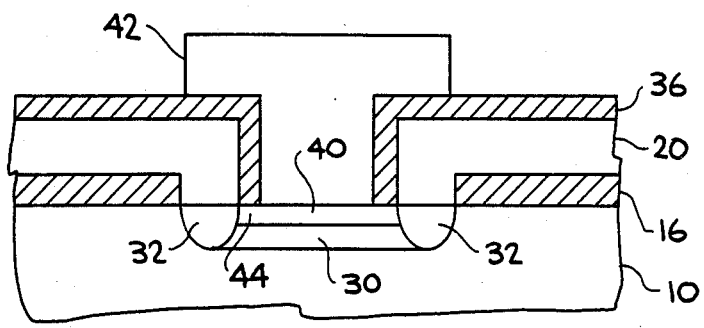
FIG. 1 is a fragmentary vertical cross-section of a prior art device.
Figure 2:
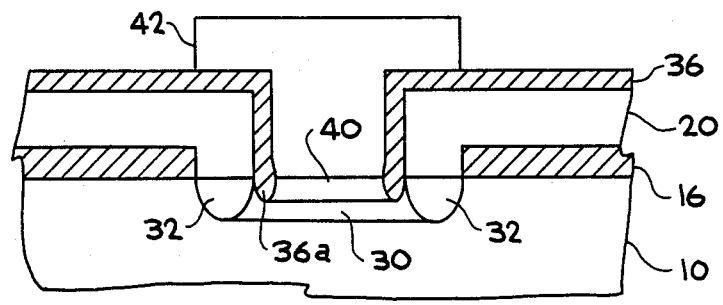
FIG. 2 is a fragmentary vertical cross-section of a device constructed in accordance with the invention.

Referring now to FIGS. 1 and 2, integrated circuit structures having self-aligned base contacts are illustrated, respectively, representing the prior art and the construction of the invention. In both figures, a silicon substrate 10, which functions as the collector, is masked with an oxide layer 16. A polysilicon layer 20, which will eventually form the contact for the base of the transistor, is then deposited and etched to define an opening through which the intrinsic base and emitter electrodes will, respectively, be formed. The intrinsic base 30 may then be implanted into the silicon collector layer 10 through the etched opening in polysilicon layer 20. Alternatively, the intrinsic base may have already been formed before deposition of polysilicon layer 20. Subsequent oxidation of polysilicon layer 20 forms an oxide layer 36 covering the top of polysilicon 20 as well as the side walls. Other methods of forming the sidewall oxidation are also known.

At the same time oxide layer 36 is grown, dopant from layer 20, may be diffused into silicon substrate 10 to form self-aligned extrinsic base regions 32 which provide the electrical contact to intrinsic base 30.

Subsequent formation of emitter 40 and its contact 42 complete the basic construction of the active device. However, it will be noted that in the prior art construction of FIG. 1, the extrinsic base 32 can be in contact with emitter 40 at 44. This will result in the formation of a parasitic P-N junction which will affect the gain of the device. In contrast, the structure of the invention, as shown in FIG. 2, provides an oxide portion 36a which extends into the silicon substrate to provide an isolation or insulating barrier between extrinsic base 32 and emitter 40 to eliminate formation of the undesirable P-N junction.

The provision of an insulating barrier portion between the extrinsic base of a self-aligned active device and an emitter or other electrode formed over the intrinsic base may be accomplished using several techniques which will, hereinafter, be described. It should be noted, however, that while the silicon substrate beneath the intrinsic base is referred to herein as a collector and while the electrode formed in or above the surface of the intrinsic base is referred to as an emitter, the teachings of the present invention may also be applicable to an active device having a collector formed above the intrinsic base, i.e., an active device with a buried emitter.

FIGS. 3a-e illustrate the step by step construction of the improved device of the invention in accordance with one embodiment of the invention. A silicon oxide mask 16, which defines the opening through which the active device will be formed in substrate 10, is first formed over substrate 10. Silicon oxide mask 16 may be formed by first masking a non-oxidizing layer, such as a silicon nitride layer (not shown), covering silicon substrate 10 followed by growth of the oxide in the unmasked portion or, as shown, an oxide layer may be first grown and then selectively etched away to provide opening 8 shown in FIG. 3a. The width of opening 8 is determined by the dimensions of the active device to be constructed since the oxide mask will be used in forming the self-aligned contact structure of the extrinsic base region of the device as will be described.

Figure 3A:
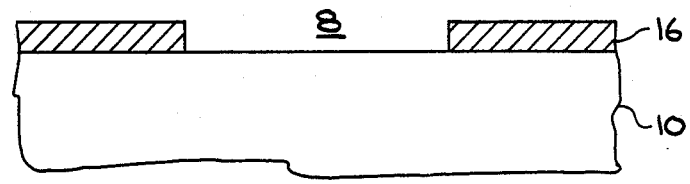
FIGS. 3a–e are fragmentary vertical cross-sections showing the steps of constructing the invention in accordance with one embodiment.
Figure 3B:
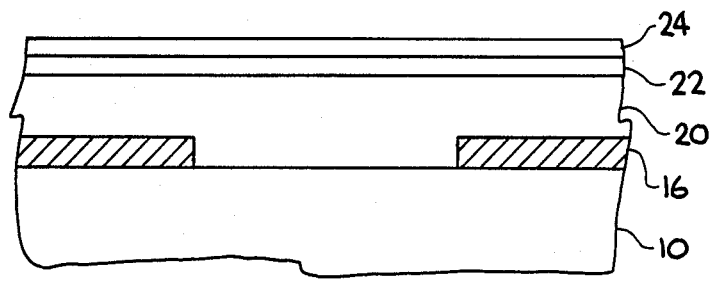
Figure 3C:
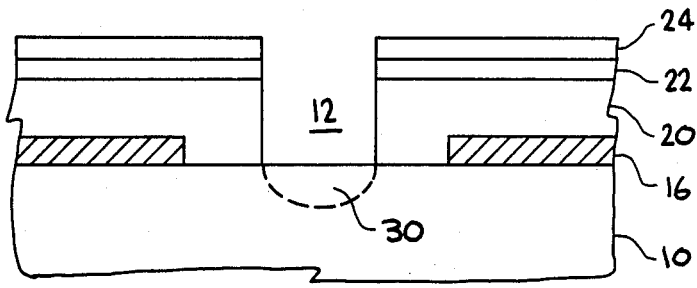

A polysilicon layer 20, is then deposited over silicon substrate 10 and oxide mask 16 followed by growth or deposition of an oxide layer 22, and formation of a silicon nitride layer 24. Layers 20, 22, and 24 are then anisotropically etched as shown in FIG. 3c to provide an opening 12 defining the width of the desired intrinsic base 30 to be formed in silicon layer 10. Intrinsic base 30 may now be formed by ion implantation into the exposed silicon substrate 10. Alternatively, the intrinsic base may be formed in opening 8 by implantation or diffusion after opening 8 is formed and before polysilicon layer 20 is deposited.

A further masking layer 26 and 26a is then applied perpendicular to the surface of the substrate to coat nitride layer 24 as well as the bottom of opening 12 at 26a. The material used for masking layer 26 and 26a may also be a nitride or may comprise a metal or any other material which will be resistant both to wet etching of the silicon as well as subsequent high temperature oxidation.

Figure 3D:
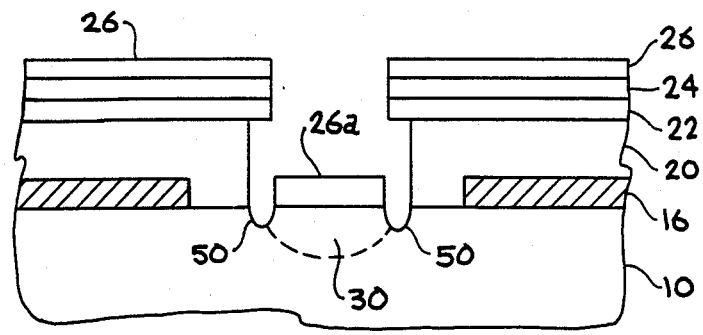

The exposed polysilicon sidewalls of opening 12 in polysilicon layer 20 are then isotropically etched to provide the undercutting of layers 22, 24, and 26 as well as to expose a portion of silicon layer 10 surrounding masked portion 26a. The exposed silicon in layer 10 is then etched sufficiently to provide etched away portions 50 in silicon substrate 10 as shown in FIG. 3d. Any conventional wet silicon etch such as, for example, a nitrichydrofluoric acid etch may be used.

The depth of the etching of silicon layer 10 at 50 will depend upon the type of emitter which will eventually be formed. If an emitter is to be deposited on the surface of intrinsic base 30, then the depth of the etched away portion 50 may be as little as a few hundred Angstroms. Alternatively, however, if an implanted emitter is to be formed in intrinsic base 30, silicon layer 10 should be etched away at 50 to a depth of from about 1000 to 2000 Angstroms.

After the isotropic etching step shown in FIG. 3d, the structure is oxidized to grow oxide layer 36 on the exposed sidewalls of polysilicon layer 20. At the same time oxide portions 36a are grown in the openings or etched away portions 50 in silicon layer 10.

The heat used in the oxidation step, may also be utilized for diffusion of dopant from polysilicon layer 20 into silicon substrate 10 where polysilicon layer 20 is not overlying oxide mask 16, to form extrinsic base regions 32. Extrinsic base regions 32 are then in self-aligned contact with polysilicon layer 20 to thereby provide electrical contact to intrinsic base 30.

At this stage, layers 26 and 26a are etched away, for example, by plasma etching or wet etching depending upon the materials used for layers 26 and 26a, and emitter 40 is formed. Emitter 40 may be formed either by implantation or by outdiffusion from polysilicon.

Figure 3E:
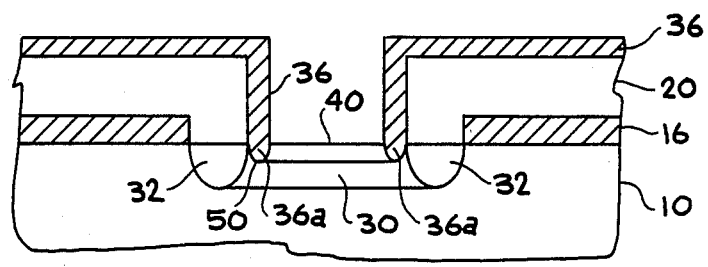

However, as clearly seen in FIG. 3e, in accordance with the invention, formation of emitter 40 does not result in direct contact between emitter 40 and extrinsic base regions 32 due to the presence of the isolation oxide 36a formed in the etched away regions 50 of silicon layer 10. Isolation oxide 36a thus prevents formation of the undesirable heavily doped P-N junction between emitter 40 and extrinsic base region 32.

In the embodiment just described, as illustrated in FIGS. 3a-e, a masked portion 26a is formed by depositing mask material 26 and 26a along a certain angle, preferably perpendicular to the wafer, if it is desired to form etched away portion 50 on both sides of the intrinsic base as illustrated. If, for some reason, it is desired to only etch away a portion 50 in silicon substrate 10 on one side of mask 26a, the mask could be applied in a direction other than perpendicular.

FIG. 4 describes another technique in which it is not necessary to deposit the mask layer 26 in a perpendicular manner. In this embodiment, the previously described steps shown in FIGS. 3a-3c are again performed. However, as shown in FIG. 4a, a layer of nitride 60, 62, and 64 is now deposited over the structure and then selectively etched, for example, with a reactive ion etch, to remove portions 60 and 62 thereby leaving layer 64 along the sidewalls of polysilicon layer 20 as shown in FIG. 4b.

Figure 4A:
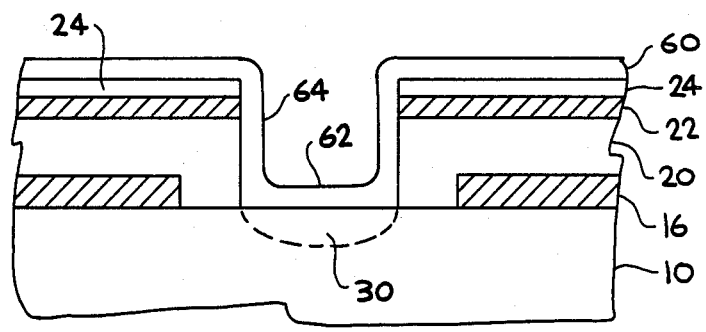
FIGS. 4a–f are fragmentary vertical cross-sections of steps used in constructing the structure of the invention in accordance with a second embodiment.
Figure 4B:
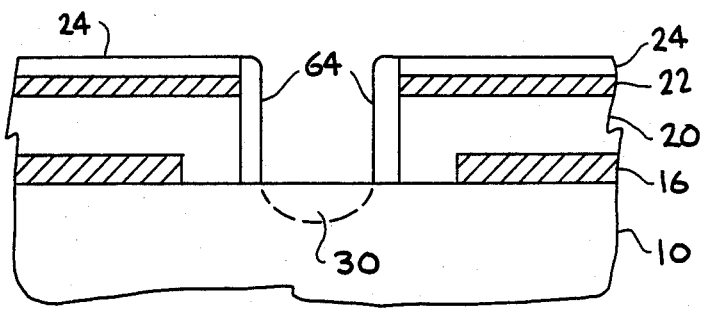
Figure 4C:
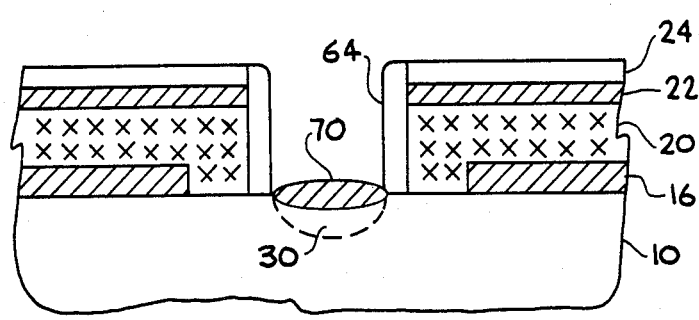
Figure 4D:
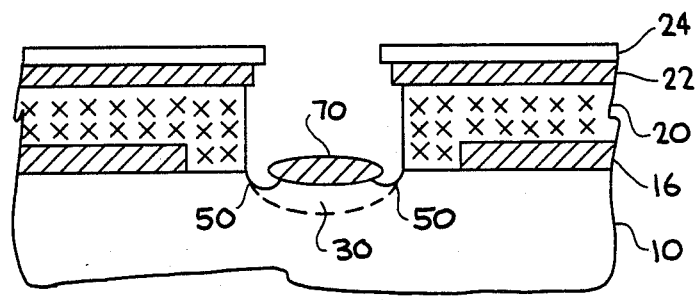
Figure 4E:
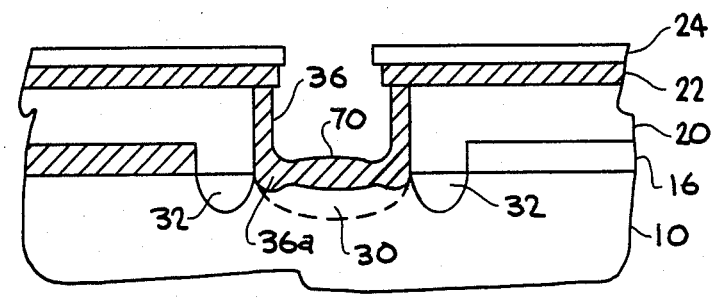

The structure is then oxidized to form oxide mask 70 in the exposed silicon substrate 10 in the implanted intrinsic base area 30. After formation of oxide 70, nitride portions 64 are isotropically etched away with a nitride etchant such as phosphoric acid followed by an isotropic silicon etch using, for example, a nitric-hydrofluoric acid etch to provide openings 50 in silicon substrate 10 as in the previous embodiment. The structure is then subjected to an oxidation step as shown in FIG. 4e to grow an oxide layer 36 on the walls of polysilicon layer 20 and to thicken oxide 70 and to grow oxide in the etched away portions 50 of silicon substrate 10 which results in the filling of etched away portions 50 with oxide as shown at 36a.

Figure 4F:
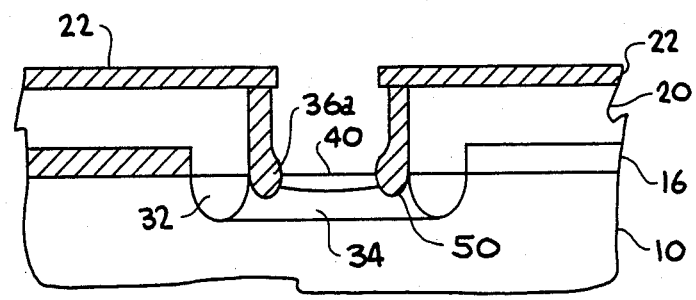

As in the previous embodiment, extrinsic base areas 32 may be simultaneously formed during the oxidation step by the thermal diffusion from polysilicon layer 20 into silicon substrate 10 to form the self-aligned contact and extrinsic base regions 32. Oxide portion 70 is then selectively removed by an anisotropic etch such as, for example, a plasma etch or the like. Emitter 40 is then formed as previously described resulting in a structure, as shown in FIG. 4f, similar to that shown in FIG. 3e. Again, it will be noted that the etched away portions 50 which are filled with oxide 36a provide an isolation or insulating barrier between emitter 40 and extrinsic base portions 32 to prevent the formation of the undesired parasitic P-N junctions.

Thus, the invention provides an improved integrated circuit structure having self-aligned polysilicon base contacts over extrinsic base regions in contact with an intrinsic base wherein an isolating oxide is formed to prevent the formation of a parasitic P-N junction between an emitter formed on top of the intrinsic base and the adjacent extrinsic base.

Having thus described the invention, what is claimed is:

1. An improved method for forming an active device in an integrated circuit structure having self-aligned contacts wherein an intrinsic base region is formed over a buried collector region and one or more extrinsic base regions are formed adjacent to said intrinsic base region to provide said self-aligned contact through the integrated circuit structure above said extrinsic base region, the improvement comprising:
   (a) forming a polysilicon layer over a silicon layer masked with an oxide layer to form an opening therein;
   (b) Selectively etching said masked polysilicon anisotropically to expose a portion of said silicon substrate corresponding to said intrinsic base region;
   (c) forming a protective mask over the exposed silicon substrate at the bottom of said etched opening;
   (d) isotropically etching the polysilicon sidewalls of said opening to enlarge the width of said opening and to expose a peripheral portion of said silicon substrate at the bottom of said opening adjacent said protective mask;
   (e) etching said exposed peripheral portion of said silicon substrate at the bottom of said opening adjacent to said protective mask to a depth greater than the normal depth of the formation of an electrode over said intrinsic base but insufficient to separate the intrinsic base from the adjacent extrinsic base upon subsequent oxidation of the exposed silicon;
   (f) oxidizing said etched polysilicon sidewalls of said opening and the etched silicon bottom portions of said opening adjacent said protective mask; and
   (g) removing said protective mask; whereby subsequent formation of an emitter on said intrinsic base region will not result in the formation of parasitic P-N junctions between said emitter and said adjacent extrinsic base region because of the presence of oxide in said etched away peripheral regions of said silicon substrate.

2. An improved method for forming an active device in an integrated circuit sturcture having self-aligned contacts wherein an intrinisic base is formed over a buried collector in a silicon substrate and one or more extrinsic base segments are formed adjacent to said intrinisic base to provide said self-aligned contact through the integrated circuit structure above said extrinisic base segments, the improvement comprising, forming an isolating oxide region between said extrinsic base segment and an emitter electrode formed in contact with said intrinsic base to prevent formation of parasitic P-N junctions between said emitter and said adjacent extrinsic base segment by the following steps:
   (a) forming a layer of polysilicon doped with impurities over said silicon substrate to form said extrinsic base segments by subsequent diffusion of said impurities from said polysilicon layer into said substrate and to form said self-aligned contacts;
   (b) selectively etching an opening in said polysilicon layer to expose a portion of the underlying silicon substrate;
   (c) forming said intrinsic base in said exposed silicon substrate;
   (d) masking said intrinsic base area in said silicon substrate;
   (e) etching the polysilicon walls of said opening to expose a portion of said silicon substrate adjacent to said intrinsic base area;
   (f) etching away said exposed portion of said silicon substrate adjacent said intrinsic base; and
   (g) growing sufficient oxide in said etched away portion of said substrate to form said oxide isolating region between said extrinsic base segment and said emitter electrode.

3. The method of claim 2 wherein said step of masking said intrinsic base area comprises the step of forming a nitride mask over said intrinsic base region prior to etching said polysilicon walls.

4. The method of claim 2 wherein said step of masking said intrinsic base region comprises the further steps of forming a nitride layer over said intrinisic base region and the sidewalls of said opening in said polysilicon layer; selectively removing that portion of said nitride layer overlying said intrinsic base region, oxidizing the surface of said intrinsic base region to form an oxide mask; selectively removing said nitride from the sidewalls of said polysilicon opening; oxidizing said sidewalls of said polysilicon opening; and then removing said oxide mask from said intrinsic base region.

5. The method of claim 2 wherein said silicon substrate is etched to a depth of from 100 to 200 Angstroms to permit subsequent growth of sufficient oxide therein to form said isolating oxide region to separate said extrinsic base segment from said emitter.

6. An improved method for forming an active device in an intergrated circuit structure having self-aligned contacts wherein an intrinsic base is formed over a buried collector in a silicon substrate and one or more extrinsic base segments are formed adjacent to said intrinsic base to provide said self-aligned contact through the integrated circuit structure above said extrinsic base segments, the improvement comprising:
   (a) forming a layer of polysilicon doped with impurities over said silicon substrate to form said extrinsic base segments by subsequent diffusion of said impurities from said polysilicon layer into said substrate and to form said self-aligned contacts;
   (b) selectively etching an opening in said polysilicon layer to expose a portion of a underlying silicon substrate to permit formation of an intrinsic base region in said exposed silicon; and
   (c) forming an isolating oxide region between said extrinsic base segment an an emitter electrode subsequently formed in contact with said intrinsic base, said forming comprising the following steps:
      (1) etching the sidewalls of said opening to expose a further portion of said silicon substrate adjacent said intrinisc base region
      (2) etching away at least a portion of said exposed silicon substrate; and (3) forming said isolation oxide in said etched away portion of said substrate by oxidizing a portion the sidewall of said opening in said polysilicon layer and silicon in said substrate adjacent said etched away portion;

whereby formation of parasitic P-N junctions between said emitter and said adjacent extrinsic base segment is prevented by said isolation oxide formed therebetween.

7. The process of claim 6 wherein said step of forming said isolation oxide in said etched away portion of said silicon substrate further includes forming an oxide surface of the sidewall of said opening said polysilicon layer to provide isolation between said polysilicon and said emitter electrode formed over said intrinsic base region.

8. An improved method of forming an active device in a silicon substrate which comprises:
   (a) growing a layer of oxide on a silicon substrate having an opening therethrough to said substrate;
   (b) depositing a layer of polysilicon over said oxide layer and silicon substrate;
   (c) anisotropically etching said polysilicon layer to expose a selected portion of said silicon substrate within said oxide opening;
   (d) forming an intrinsic base in said exposed silicon substrate;
   (e) masking said exposed silicon substrate having said intrinsic base formed therein;
   (f) etching the sidewalls of said etched polysilicon layer to expose silicon substrate adjacent said masked area of said substrate;
   (g) etching said exposed silicon substrate to form an etched away region having a depth of from 100 to 2000 Angstroms;
   (h) growing sufficient oxide in said etched silicon substrate to fill said etched away region;
   (i) forming an extrinsic base segment in said silicon substrate adjacent said intrinsic base region by diffusing polysilicon into said silicon substrate;
   (j) removing said mask over said intrinsic base region; and
   (k) forming an emitter over at least a portion of said intrinsic base region.

9. The method of claim 8 wherein said opening in said oxide layer is formed by masking said silicon substrate prior to said step of growing said oxide layer.

10. The method of claim 8 wherein said opening in said oxide layer is subsequently formed by selectively etching said oxide layer.

* * * * *